United States Patent [19]

Mizuno

[11] Patent Number: 4,738,914
[45] Date of Patent: Apr. 19, 1988

[54] PHOTOSENSITIVE MEMBER HAVING AN AMORPHOUS SILICON LAYER

[75] Inventor: Hiroshi Mizuno, Ikoma, Japan

[73] Assignee: Minolta Camera Kabushiki Kaisha, Osaka, Japan

[21] Appl. No.: 884,670

[22] Filed: Jul. 16, 1986

Related U.S. Application Data

[63] Continuation of Ser. No. 614,022, May 25, 1984, abandoned.

[30] Foreign Application Priority Data

Jun. 2, 1983 [JP] Japan ................................. 58-98940
Jun. 3, 1983 [JP] Japan ................................ 58-100056
Jun. 6, 1983 [JP] Japan ................................ 58-101422

[51] Int. Cl.⁴ ..................... G03G 15/02; G03G 15/04; G03G 15/08; G03G 5/08
[52] U.S. Cl. .......................... 430/84; 430/57; 430/60; 430/63; 430/65; 430/66; 430/67; 430/85; 430/95
[58] Field of Search ...................... 430/57, 60, 63, 65, 430/84, 85, 95, 66, 67

[56] References Cited

U.S. PATENT DOCUMENTS

| | | | |
|---|---|---|---|
| 4,394,425 | 7/1983 | Shimizu et al. | 430/65 |
| 4,409,308 | 10/1983 | Shimizu et al. | 430/60 |
| 4,414,319 | 11/1983 | Shirai et al. | 430/65 |
| 4,443,529 | 4/1984 | Kanbe et al. | 430/65 |
| 4,451,546 | 5/1984 | Kawamura et al. | 430/69 |
| 4,452,874 | 6/1984 | Ogawa et al. | 430/57 |
| 4,452,875 | 6/1984 | Ogawa et al. | 430/57 |
| 4,460,669 | 7/1984 | Ogawa et al. | 430/57 |
| 4,460,670 | 7/1984 | Ogawa et al. | 430/57 |
| 4,465,750 | 8/1984 | Ogawa et al. | 430/57 |
| 4,483,911 | 11/1984 | Ogawa et al. | 430/65 |
| 4,486,521 | 12/1984 | Misumi et al. | 430/65 |
| 4,489,149 | 12/1984 | Kawamura et al. | 430/65 |
| 4,490,453 | 12/1984 | Shirai et al. | 430/65 |
| 4,490,454 | 12/1984 | Misumi et al. | 430/84 |
| 4,491,626 | 1/1985 | Kawamura et al. | 430/57 |
| 4,501,807 | 2/1985 | Shirai et al. | 430/57 |

Primary Examiner—Mukund J. Shah
Attorney, Agent, or Firm—Watson, Cole, Grindle & Watson

[57] ABSTRACT

The invention disclosed relates to a photosensitive member with an amorphous silicon photoconductive layer. On the photoconductive layer, an insulating layer including amorphous silicon, carbon and oxygen is formed. The amount of carbon is 5 to 65 atomic % and less than 10 atomic % for oxygen if both carbon and oxygen are included uniformly throughout the layer. An amorphous silicon barrier layer containing either oxygen and boron or oxygen and carbon may be formed between the substrate and the photoconductive layer.

6 Claims, 3 Drawing Sheets

PHOTOSENSITIVE MEMBER HAVING AN AMORPHOUS SILICON LAYER

This is a continuation of application Ser. No. 614,022, filed May 25, 1984 and now abandoned.

BACKGROUND OF THE INVENTION

1. Field of the Invention

The present invention relates to a photosensitive member having a photoconductive layer which includes at least amorphous silicon.

2. Description of the Prior Art

Photosensitive members of various types have already been proposed. Among other things, attention has been focussed on the application to such photosensitive members of amorphous silicon (hereinafter abbreviated as "a-Si"), amorphous germanium (a-Ge) and amorphous silicon-germanium (a-Si:Ge) which are produced by the processes such as glow discharge decomposition and sputtering. This is attributable to the fact that photosensitive members made of a-Si, a-Ge and a-Si:Ge are much superior to those of selenium or CdS in heat resistance and abrasion resistance, and also from the viewpoint of environmental pollution.

However, photosensitive members comprising photoconductive layers of a-Si, a-Ge and a-Si:Ge have an insufficiently low dark resistance. As such, such photoconductive layers cannot be formed to also have a charge retaining function. For this purpose, Published Unexamined Japanese Patent Application No. Sho 54-145539 proposes to include oxygen and/or nitrogen in an a-Si photoconductive layer to improve the dark resistivity. However, this in turn deteriorates its photosensitivity, indicating that the amount of oxygen and/or nitrogen that can be included will inevitably have a limit.

In view of the above, there has been proposed in Published Unexamined Japanese Patent Application No. SHO 57-115551 a photosensitive member which comprises an a-Si photoconductive layer and an a-Si insulating layer formed on the photoconductive layer and containing a large amount of carbon. However, inclusion of carbon in such a photosensitive member will cause the electro photographic characteristic to greatly vary depending on the amount of carbon. For example, when the amount of carbon included in the a-Si insulating layer is relatively small, the layer itself will not be sufficiently high in resistance and the light fatigue of the layer becomes large and an image blur is caused under highly humid conditions. On the other hand, a large amount of carbon will improve the charge-retaining capability and the light transparency of the insulating layer, but in turn causes the hardness of the layer to become weak. Additionally, a white dot pattern appears on the image formed due to layer defects in highly humid conditions.

Moreover, when the a-Si photoconductive layer is directly formed on an electroconductive substrate, patterns such as white dots and pin holes appear on the image obtained. This is attributable to defects of the a-Si photoconductive layer causing leakage of charge carriers. Such defects easily occur depending on the surface condition and contamination of the electroconductive substrate. Further, charges are easily injected from the substrate to deteriorate the dark decay characteristic which in turn causes the charge retaining ability to become poor.

SUMMARY OF THE INVENTION

It is accordingly a primary object of the present invention to provide a photosensitive member which has either an insulating layer formed on a photoconductive layer of amorphous silicon or a barrier layer formed between an electroconductive substrate and the photoconductive layer and which is free of light fatigue and having excellent electrophotographic characteristics.

Another object of the present invention is to provide a photosensitive member having a novel insulating layer formed on an amorphous silicon photoconductive layer which is free of light fatigue, which exhibits excellent electrophotographic characteristics inclusive of photosensitivity, charge retaining capability and surface hardness, and which is capable of forming images of good quality over a long period of time even with continuous copying under highly humid conditions.

Still another object of the present invention is to provide a photosensitive member having a novel barrier layer formed between an electroconductive substrate and an amorphous silicon photoconductive layer which is effective in preventing injection of charges from the substrate as well as in preventing residual potential to rise by continuous copying and which has excellent levelling effect for the photoconductive layer.

Still another object of the present invention is to provide a photosensitive member which includes a barrier layer, a photoconductive layer and an insulating layer and which has excellent electrophotographic characteristics but free of light fatigue, which is effective in preventing injection of charges from a substrate as well as in preventing residual potential from rising and which is capable of forming images of good quality for a long run even with continuous copying under highly humid conditions.

These and other objects of the present invention can be achieved with a photosensitive member comprising either an insulating layer which includes amorphous silicon, oxygen and carbon and which is positioned on a photoconductive layer including amorphous silicon. In another form, a barrier layer which includes either amorphous silicon, oxygen and a Group IIIA impurity of the Periodic Table or amorphous silicon, oxygen and carbon is positioned between an electroconductive substrate and a photoconductive layer of amorphous silicon. Additionally, the photosensitive member of the present invention may comprise both the insulating layer and the barrier layer with the photoconductive layer positioned therebetween.

DETAILED DESCRIPTION OF THE INVENTION

Figure 1:
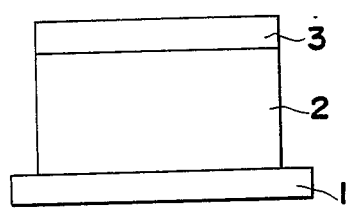
FIG. 1 illustrates the laminated construction of the photosensitive member according to first embodiment of the present invention.

FIG. 1 illustrates the construction of a photosensitive member in accordance with first embodiment of the invention wherein 1 is an electrically-conductive substrate and 2 and 3 are respectively a photoconductive layer including at least a-Si and an insulating layer including a-Si, carbon and oxygen as laminated in that order on the substrate 1.

The photoconductive layer 2 including a-Si to be formed on the substrate 1 is formed to a thickness of about 5 to 100 microns, preferably about 10 to 60 microns, for example by glow discharge decomposition or sputtering. As an example of forming the a-Si photoconductive layer, gases like $SiH_4$, $Si_2H_6$, $B_2H_6$ are fed into a pressure reducible reaction chamber with $H_2$ or Ar used as a carrier gas and the glow discharge is effected under application of high frequency power, thereby forming on the substrate the a-Si photoconductive layer including hydrogen and further boron, if necessary. $GeH_4$ gas may concurrently be fed to form an a-Si:Ge photoconductive layer. The photoconductive layer 2 formed in this way may have a dark resistance of low value, and in order to improve the dark resistance, an impurity of Group IIIA of the Periodic Table and a small amount of oxygen, carbon or nitrogen may be added. As an example, U.S. Pat. No. 4,489,149 discloses that 10 to 40 atomic % of hydrogen, less than 0.05 atomic % of oxygen and 10 to 20,000 ppm of boron may be incorporated in the a-Si photoconductive layer to improve its dark resistance without sacrificing its photosensitivity.

The insulating layer 3 including a-Si is produced likewise on the photoconductive layer 2 to a thickness of about 0.01 to 3 microns, for example by glow discharge decomposition or sputtering. This insulating layer 3 has a resistivity higher than that of the photoconductive layer 2 and its resistivity is either substantially uniform throughout the layer or gradually becomes higher toward its surface from the boundary with the photoconductive layer 2. Specifically, the insulating layer 3 includes carbon and oxygen in addition to the main constituent of a-Si or a-Si:Ge. By this, the resistivity of the insulating layer 3 is increased and also the electrophotographic characteristics of the photosensitive member such as surface hardness and photosensitivity are remarkably improved. Moreover, the photosensitive member as such is free of light fatigue and is superior from the viewpoint of environmental pollution. This is to say that the surface hardness of the insulating layer with only carbon included becomes gradually low with the increase of the amount of carbon so that the photosensitive member with such insulating layer is not suited for repetitive copying for a long period of time. Additionally, patterns of white dots appear on the images formed, causing image blur when only carbon is included in the insulating layer.

In the present invention, various drawbacks described above have been overcome by including oxygen in addition to carbon in the insulating layer 3 of a-Si. Inclusion of oxygen remarkably improves the light transparency of the insulating layer 3, and according to experiments described hereinbelow, the photosensitivity of the photosensitive member with the insulating layer containing about 5 atomic % of oxygen in addition to 40 atomic % of carbon is about 1.8 times higher than the one with only 40 atomic % of carbon in the insulating layer. Also, no deterioration in the surface hardness of the insulating layer 3 was observed; instead, an improvement in the surface hardness was observed. Moreover, images of high quality can be obtained over a long period of time without image blur or white dot pattern appearing even under highly humid or continuous copying conditions.

The amounts of oxygen and carbon included in the insulating layer 3 will differ for the case in which they are included uniformly throughout the layer and for the case in which they are included in a way that the amounts gradually increase in the direction of the thickness, i.e., toward the surface of the layer 3. In the case of including carbon and oxygen uniformly in the insulating layer 3, it is preferable that the amount of carbon be about 5 to 65 atomic % relative to a-Si and a very small amount (such as 0.01 atomic %) to about 10 atomic % for the amount of oxygen relative to a-Si. The minimum amounts should be 5 atomic % for carbon about 0.01 atomic % for oxygen because the amounts therebelow will be insufficient to raise the resistivity of the insulating layer 3 and, moreover, the light transparency will be poor and light fatigue will become noticeable. The amount of carbon should be no more than about 65 atomic % and the amount of oxygen no more than 10 atomic % because amounts exceeding these values will cause image blur as well as deterioration in the surface hardness of the layer 3.

The amount of carbon in the insulating layer 3 should be 5 to 65 atomic % as described above, but about 40 to 65 atomic % is more preferable. If the amount of carbon is less than 40 atomic %, particularly less than 30 atomic %, the resistivity of the insulating layer will not be sufficiently high even with oxygen included. Thus, if the photosensitive member is exposed to light of a wavelength of 400 to 650 nm, the light will partially be absorbed by the insulating layer and this may cause blur in images reproduced. However, carbon of more that 40 atomic % assures the insulation of the layer 3 and the light will be absorbed by the photoconductive layer. Accordingly, it is preferable that if the amount of carbon is less than 40 atomic % in the insulating layer, such photosensitive member, although useable in normal copier, should be used in a copier with an exposure source of longer wavelength of 650 nm or more, such as in a laser beam printer.

If carbon and oxygen are included with the amount of each varying in the direction of the thickness, the amount of each should gradually increase in the direction of the thickness of the insulating layer 3. In this case, about 1 to 65 atomic % of carbon and a very small amount (about 0.01 atomic %) to 25 atomic % of oxygen can be included in the layer 3. There is no necessity to vary the amount of both carbon and oxygen. Instead, it is possible to fix the amount of carbon constant throughout the layer with the amount of oxygen gradually increasing or vice versa. In the case of the latter, i.e., in the case of the amount of oxygen being constant with the carbon amount gradually increasing, the maximum amount of oxygen should be about 10 atomic %.

To form the insulating layer 3 by glow discharge decomposition, $O_2$ and $C_2H_4$ gases are introduced concurrently with $SiH_4$ gas (further $GeH_4$ gas if necessary).

If the insulating layer is to be formed with the resistivity substantially uniform throughout the layer, then the amounts of $O_2$ and $C_2$ and $C_2H_4$ gases flown are held constant relative to $SiH_4$ (and $GeH_4$) gas. On the other hand, the amount of either or both $O_2$ and $C_2H_4$ gases flown should gradually be increased if the resistivity of the layer 3 is to have gradual increase in the thickness of the layer.

Figure 2:
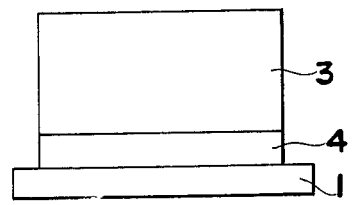
FIG. 2 illustrates the laminated construction of the photosensitive member according to second embodiment of the present invention.

Referring now to FIG. 2, which shows the second embodiment of the photosensitive member in accordance with the present invention, 4 is a barrier layer or an intermediate layer formed between the substrate 1 and the photoconductive layer 2. The photoconductive layer 2 is identical to the one described in connection with FIG. 1.

The barrier layer 4 can be comprised of a-Si (or a-Si:Ge), oxygen and an impurity of Group IIIA element of the Periodic Table, i.e., the barrier layer 4 is a-Si$x$-O$_{1-x}$ or (a-Si$x$O$_{1-x}$)$_y$H$_{1-y}$ with a Group IIIA impurity added. This barrier layer 4 is formed on the substrate 1 by glow discharge decomposition or sputtering to a thickness of about 0.003 to 2 microns, preferably 0.005 to 0.5 micron, and most preferably 0.01 to 0.2 micron. Oxygen is included in the barrier layer 4 in an amount of about 5 to 60 atomic % and this remarkably increases the resistivity of the layer 4 to effectively prevent injection of charges from the substrate 1. Inclusion of oxygen is also effective on the leveling effect and coating characteristic of the barrier layer to the substrate. However, oxygen alone in a-Si or a-Si:Ge will cause residual potential to rise and because of this, the barrier layer 4 of the present invention further includes a Group IIIA impurity of the Periodic Table, preferably boron in the amount of less than about 200 ppm. Addition of boron allows charge carriers generated in the photoconductive layer 2 to move through the barrier layer 4 to the substrate 1 more easily and this effectively prevents a rise of residual potential.

The amount of oxygen included in the barrier layer 4 should be more than 5 atomic % as the amount therebelow is insufficient to improve the resistivity of the layer. The amount should not exceed 60 atomic % because images become fogged and the residual potential is caused to rise even with boron included. As for boron, the amount thereof should be no more than 200 ppm because the charge accepting ability of the photosensitive member becomes poor with the amount exceeding 200 ppm.

The barrier layer 4 can also be comprised of at least a-Si (or a-Si:Ge), carbon and oxygen. This barrier layer 4 contains with respect to a-Si or a-Si:Ge about 5 to 60 atomic of carbon and a very small amount (0.01 atomic %) to about 10 atomic % of oxygen. The inclusion of carbon and oxygen not only remarkably increases the resistivity of the barrier layer 4 to effectively prevent injection of charges from the substrate 1, but also is effective on the leveling effect and coating characteristic of the barrier layer to the substrate 1. Additionally, the inclusion of oxygen together with carbon allows movement of charge carriers generated in the photoconductive layer 2 to the substrate 1, thereby preventing a rise of residual potential.

The amount of carbon included in the barrier layer 4 should be more than 5 atomic % because the amount therebelow is insufficient to improve the resistivity of the layer 4. As for oxygen, the amount should not exceed 10 atomic % as the images obtained become fogged. In this connection the barrier layer 4 has a thickness of 0.003 micron or more because a thinner thickness will be ineffective to prevent injection of charges from the substrate 1, and it has a thickness of less than 2 microns because a thicker thickness cannot prevent the residual potential from rising. A good result can be obtained with a thickness of 0.005 to 0.5 micron and a best result at 0.01 to 0.2 micron.

The barrier layer 4 of the second form may further contain an impurity of Group IIIA element of the Periodic Table, preferably boron in an amount of less than 200 ppm. Carbon together with oxygen enables charge carriers to move through the barrier layer but inclusion of the Group IIIA impurity in addition thereto further enhances charge carriers moving through more easily so that rise of residual potential is effectively prevented. Boron can be included in the barrier layer 4 by concurrently feeding, for example, $B_2H_6$ gas with $SiH_4$ (and $GeH_4$ if necessary), $O_2$ and $C_2H_4$ gases into the pressure reducible chamber. Thereafter, the photoconductive layer 2 is formed on the barrier layer 4 to produce the photosensitive member shown in FIG. 2.

Figure 3:
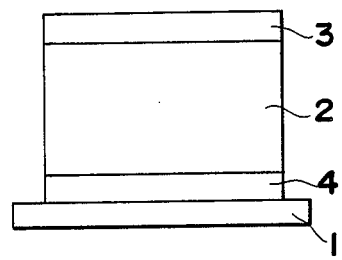
FIG. 3 illustrates the laminated construction of the photosensitive member according to third embodiment of the present invention.

FIG. 3 shows the photosensitive member of the third embodiment in accordance with the present invention. On the substrate 1 there is sequentially formed the barrier layer 4, the photoconductive layer 2 and the insulating layer 3. The barrier layer 4 has been described in connection with FIG. 2 and is formed of a-Si or a-Si:Ge which contains about 5 to 60 atomic % of oxygen and less than 200 ppm of Group IIIA impurity in the first form or about 5 to 60 atomic % of carbon, a very small amount to 10 atomic % of oxygen and if only necessary, the Group IIIA impurity in the amount of less than 200 ppm. This barrier layer 4 has a thickness of 0.003 to 2 microns and is capable of preventing injection of charges from the substrate 1 and allowing charge carriers to move through the layer 4.

The photoconductive layer 2 including at least a-Si and having a thickness of about 5 to 100 microns is formed on the barrier layer 4. This photoconductive layer 2 is same as the one described in connection with FIG. 1 and the detailed description may be referred thereto. The insulating layer 3 formed on the photoconductive layer 2 has also been described in connection with FIG. 1 and contains carbon and oxygen in a-Si or a-Si:Ge. As has been described, the insulating layer 3 of a-Si includes about 5 to 65 atomic %, preferably 40 to 65 atomic % of carbon and a very small amount to 10 atomic % of oxygen if both carbon and oxygen are to be included uniformly throughout the layer. The amount of carbon should be 1 to 65 atomic % and a very small amount to 25 atomic % for oxygen if their contents are to be varied in the direction of the thickness.

In forming the photosensitive members shown in FIGS. 1 to 3, i.e., in forming each of the layers 2, 3 and 4, hydrogenated silicon gases of Si and H atoms such as $SiH_4$, $Si_2H_6$, $Si_3H_8$ and $Si_4H_{10}$ may be used in including a-Si in each layer. When including carbon as in the barrier layer 4 and the insulating layer 3, saturated hydrocarbons with 1 to 5 carbons such as $CH_4$, $C_2H_6$, $C_3H_8$ and n-$C_4H_{10}$, hydrocarbons of ethylene series with 1 to 5 carbons such as $C_2H_4$, $C_3H_6$ and $C_4H_8$ and hydrocarbons of acetylene series such as $C_2H_2$, $C_3H_4$ and $C_4H_6$ may be used. For including oxygen, gases such as $O_2$, $O_3$, CO, $CO_2$, NO, $NO_2$, $N_2O$, $N_2O_3$, $N_2O_4$, $N_2O_5$ and $NO_3$ may be used. Germanium may further be included in each of the layer and in this case, gases such as $GeH_4$ and $Ge_2H_6$ may be concurrently fed with hydrogenated silicon gas. In each layer, it is believed particularly in the case of formation by the glow discharge decomposition that hydrogen in the amount of about 10 to 40 atomic % is included as the gases such as SiH$_4$ and B$_2$H$_6$ are used.

In the following, a capacitive coupling type glow discharge decomposition apparatus for the production of the photosensitive member in accordance with the present invention is described.

Figure 4:
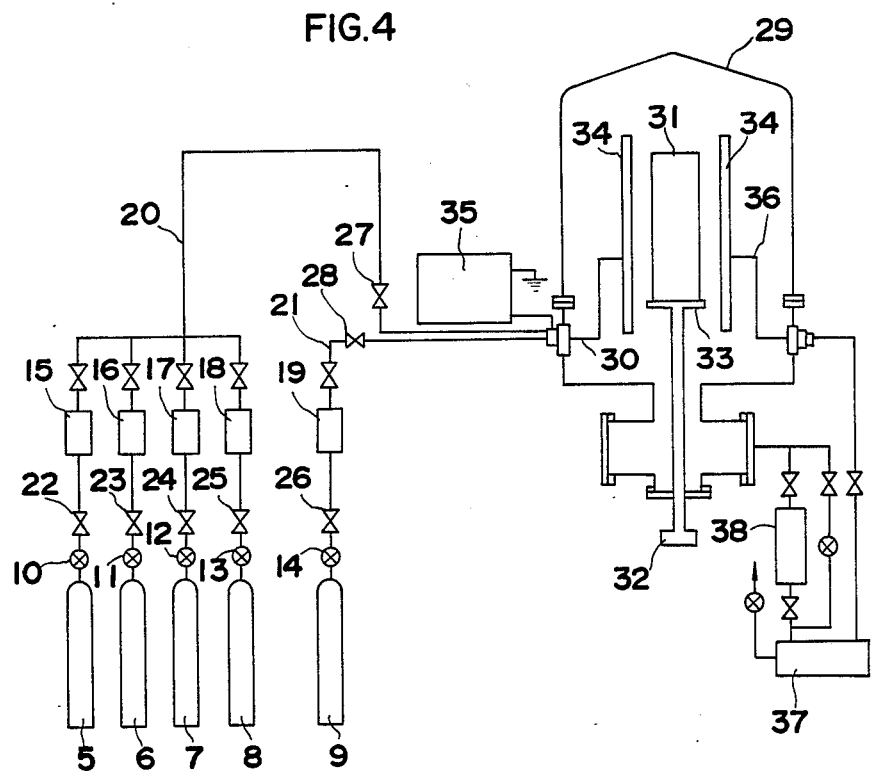
FIG. 4 illustrates a glow discharge decomposition apparatus for producing the photosensitive member according to the present invention.

In FIG. 4, a first, second, third, fourth and fifth tanks 5, 6, 7, 8 and 9 contain H$_2$, SiH$_4$, B$_2$H$_6$, C$_2$H$_4$ and O$_2$ gases, respectively, in the leak-free state. H$_2$ gas in the first tank 5 is a carrier gas for SiH$_4$ and H$_2$ is used for B$_2$H$_6$ gas as well. Ar or He may also be used in place of hydrogen. A tank for GeH$_4$ gas is also necessary if any of the layer to be formed is to contain germanium. The above-mentioned gases are released by opening the corresponding first, second, third, fourth and fifth regulating valves 10, 11, 12, 13 and 14 at the flow rates controlled by respective mass flow controllers 15, 16, 17, 18 and 19. The gases from the first, second, third and fourth tanks 5, 6, 7 and 8 are led to a first main pipe 20 and the O$_2$ gas from the fifth tank 9 is led to a second main pipe 21. The numerals 22, 23, 24, 25, 26, 27 and 28 indicate check valves.

The gases flowing through the first and second main pipes 20 and 21 join in a third main pipe 30 disposed in a reaction chamber 29. In the reaction chamber 29, there is mounted a turntable 33 rotatable by means of a motor 32, and a substrate 31 of aluminum, stainless steel, NESA glass or the like on which a laryer of a-Si is to be formed is disposed on said turntable 33. The substrate 31 is electrically grounded and uniformly preheated by a suitable heating means to a temperature of about 100° to 400° C., preferably about 150° to 300° C. Surrounding the substrate 31 is a cylindrical electrode 34 which is electrically connected to a high frequency power source 35 and which is hollow inside and connected to the third main pipe 30 and fourth main pipe 36 on its outer wall portions. Although not shown, a plurality of gas discharging holes are formed on the inner wall area of the electrode 34 for discharging the gases fed from the third main pipe 30 onto the surface of the substrate 31. The gases discharged through the discharging holes are then absorbed through holes also formed on the inner wall and discharged out through the fourth main pipe 36. A high frequency power of about 0.05 to 1.5 kilowatts from the high frequency power source 35 is applied to the electrode 34 and a frequency of 1 to 50 MH$_z$ is suitable therefor. Moreover, because a high degree of vacuum (discharge pressure: 0.5 to 2 torr) is essential within the reaction chamber 24 for the formation of each of the layer shown in FIGS. 1 to 3, the chamber is connected with a rotary pump 37 and a diffusion pump 38.

If the photosensitive member shown in FIG. 1 is to be formed, an a-Si photoconductive layer 2 is first produced on the substrate 31(1). For this, the first and second regulating valves 10 and 11 are opened to release H$_2$ and SiH$_4$ gases from the first and second tanks 5 and 6 at a proper flow rate and if further necessary, oxygen gas from the fifth tank 9 by opening the fifth regulating valve 14 and/or B$_2$H$_6$ gas from the third tank 7 by opening the third regulating valve 12 are released. The amounts of gases released are controlled by mass flow controllers 15, 16, 17, 19 and the SiH$_4$ gas with H$_2$ as the carrier gas or a mixture of SiH$_4$ gas and B$_2$H$_6$ gas is fed through the first main pipe 20. At the same time, oxygen gas in a predetermined ratio to SiH$_4$ is fed through the second main pipe 21 and join with the gas from the first main pipe 20 in the third main pipe 30 to be fed to the electrode 34. With the gases discharged out uniformly from the discharging holes, a vacuum of about 0.05 to 2.0 torr is maintained in the reaction chamber 29, the substrate is maintained at 100° to 400° C., and the high frequency power to the electrode 34 is set at 0.05 to 1.5 kilowatts with the frequency at 1 to 50 MH$_z$. Under the above conditions, a glow discharge takes place to decompose the gases, whereby an a-Si photoconductive layer 2 containing at least hydrogen is formed on the substrate 31 at the speed of about 0.5 to 5 microns per hour.

When the desired thickness of the a-Si photoconductive layer 2 is formed, the glow discharge is either once discontinued or without discontinuing, an insulating layer 3 is formed. This is effected by releasing the gases from the first, second, fourth and fifth tanks 5, 6, 8 and 9. If the insulating layer 3 is to have a uniform resistivity throughout the layer, then the flow amounts from each of the tank are maintained the same, such that the layer will be included with about 5 to 60 atomic % of carbon and a very small amount to 10 atomic % of oxygen uniformly relative to a-Si. In another way of forming the insulating layer 3, the flow amounts of either C$_2$H$_4$ or O$_2$ or both are gradually increased during the formation of the insulating layer 3.

If the photosensitive members shown in FIGS. 2 and 3 are to be formed, then the barrier layer 4 is first formed on the substrate 31 by feeding H$_2$, SiH$_4$, B$_2$H$_6$ and O$_2$ gases or H$_2$, SiH$_4$, O$_2$, C$_2$H$_4$ and B$_2$H$_6$ (only if necessary) gases simultaneously to the electrode 34.

EXPERIMENTAL EXAMPLE 1

Using a glow discharge decomposition apparatus shown in FIG. 4, 10 different photosensitive members were formed.

The reaction chamber 29 was evacuated to 10$^{-6}$ torr by means of the rotary pump 37 and diffusion pump 38. Followed thereby, the first to third and fifth regulating valves 10, 11, 12 and 14 were opened to release and flow H$_2$ gas from the first tank 5, SiH$_4$ gas diluted to 30% by H$_2$ from the second tank 6, B$_2$H$_6$ gas diluted to 200 ppm by H$_2$ from the third tank 7 and further O$_2$ gas from the fifth tank 9 into the mass flow controllers 15, 16, 17, 19 under a pressure gauge showing of 1 kg/cm$^2$. By adjusting the scales of respective mass flow controllers, the flow amounts were set to 277 sccm for H$_2$, 300 sccm for SiH$_4$, 23 sccm for B$_2$H$_6$ and 1.0 sccm for O$_2$ and fed into the reaction chamber 29. The pressure inside the chamber was then adjusted to 1.0 torr after the respective flow amounts become stabilized. On the other hand, an aluminum drum of 120 mm in diameter was used as the substrate 31 and pre-heated to the temperature of 200° C.

With the flow amount of respective gases and the inner pressure of the chamber stabilized, a high frequency power of 300 watts (frequency of 13.56 MH$_z$) from the power source 35 was applied to the electrode 34 to generate glow discharge. This glow discharge was continued for about 7 hours to form a a-Si photoconductive layer 2 of about 20 microns thick on the substrate 31 and containing hydrogen, boron and a small amount of oxygen.

Upon formation of the a-Si photoconductive layer, the application of power from the high frequency power source 35 was suspended while the flow amounts of mass flow controllers were set to zero and the chamber evacuated. Thereafter, 210 sccm of $H_2$ gas from the first tank 5, 300 sccm of $SiH_4$ gas diluted to 30% by $H_2$ from the second tank 6, and 90 sccm of $C_2H_4$ gas from the fourth tank 8 were introduced into the reaction chamber 29 and a power of 300 watts from the power source 35 was applied with the inner pressure adjusted to 1.0 torr. The glow discharge was continued for 3 minutes to form an a-Si insulating layer 3 having a thickness of about 0.1 micron and containing hydrogen and about 40 atomic % of carbon. This photosensitive member will be referred to as Sample A.

In a similar way, four photosensitive members, each having the same a-Si photoconductive layer but different amounts of carbon in the insulating layer 3, were formed by varying the flow amount of $C_2H_4$ gas. These photosensitive members, referred to as Samples B, C, D and E, contained the following amount of carbon:

| Sample | Amount of Carbon (Atomic %) |
|---|---|
| A | 40 |
| B | 7 |
| C | 16 |
| D | 60 |
| E | 70 |

In the similar way as above, the a-Si photoconductive layer 2 was formed on the substrate 31 and thereafter the chamber 29 was evacuated. Then, 200 sccm of $H_2$ gas from the first tank 5, 300 sccm of $SiH_4$ gas diluted to 30% by $H_2$ from the second tank 6, 90 sccm of $C_2H_4$ gas from the fourth tank 8 and 10 sccm of $O_2$ gas from the fifth tank 9 were introduced into the chamber 29 and a power of 300 watts from the power source 35 was applied with the inner pressure adjusted to 1.0 torr. The glow discharge was continued for 3 minutes to form the insulating layer 3 of about 0.1 micron thick and containing a-Si, hydrogen, about 40 atomic % of carbon and 5 atomic % of oxygen. This photosensitive member will be referred to as Sample F. Four other photosensitive members, each having same a-Si photoconductive layer but different amounts of carbon in the insulating layer, were formed. These photosensitive members, referred to as Sample G, H, I and J, contained following amounts of carbon and oxygen in the insulating layer:

| Sample | Amount of Carbon | Amount of Oxygen |
|---|---|---|
| F | 40 | 5 |
| G | 7 | 5 |
| H | 16 | 5 |
| I | 60 | 5 |
| J | 70 | 5 |

Figure 5:
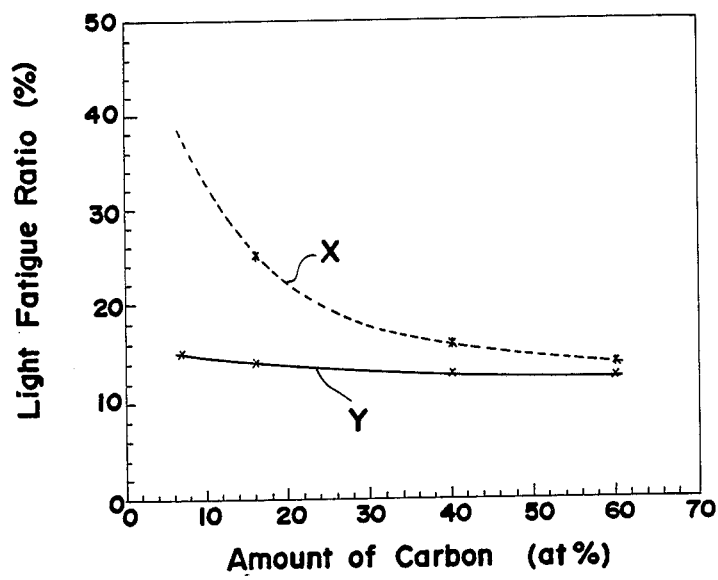
FIG. 5 is a graph showing the relationship between light fatigue ratio and amount of carbon in the insulating layer of the photosensitive member.

Each of these Samples A-J were placed in a photosensitive testing device and subjected to corona charging and light erasing repeatedly. As the result, Samples A, B, C, D and E with no oxygen in the insulating layer exhibited a drop in surface potential. The degree of this drop or decrease of the surface potential has been shown to become large as the amount of carbon in the insulating layer is decreased and to become small as the amount of carbon is increased. On the other hand, those Samples F, G, H, I and J with oxygen in the insulating layer showed generally a small degree of drop of surface potential. This degree of drop of the surface potential is called "light fatigue" and is defined by the difference in surface potentials in the first rotation ($V_{01}$) and the tenth rotation ($V_{010}$) of the photosensitive member, i.e., Light fatigue ratio $= [(V_{01} - V_{010})/V_{01}] \times 100$ FIG. 5 shows the relationship between this light fatigue ratio and the amounts of carbon and oxygen in the insulating layer. As apparent from FIG. 5, the light fatigue ratio of Samples A-D which contained only carbon aside from a-Si and hydrogen and represented by curve X became large as the amount of carbon decreased. In contrast thereto, those samples F-I containing also oxygen in the insulating layer showed quite stable light fatigue ratio regardless of the amount of carbon therein.

Figure 6:
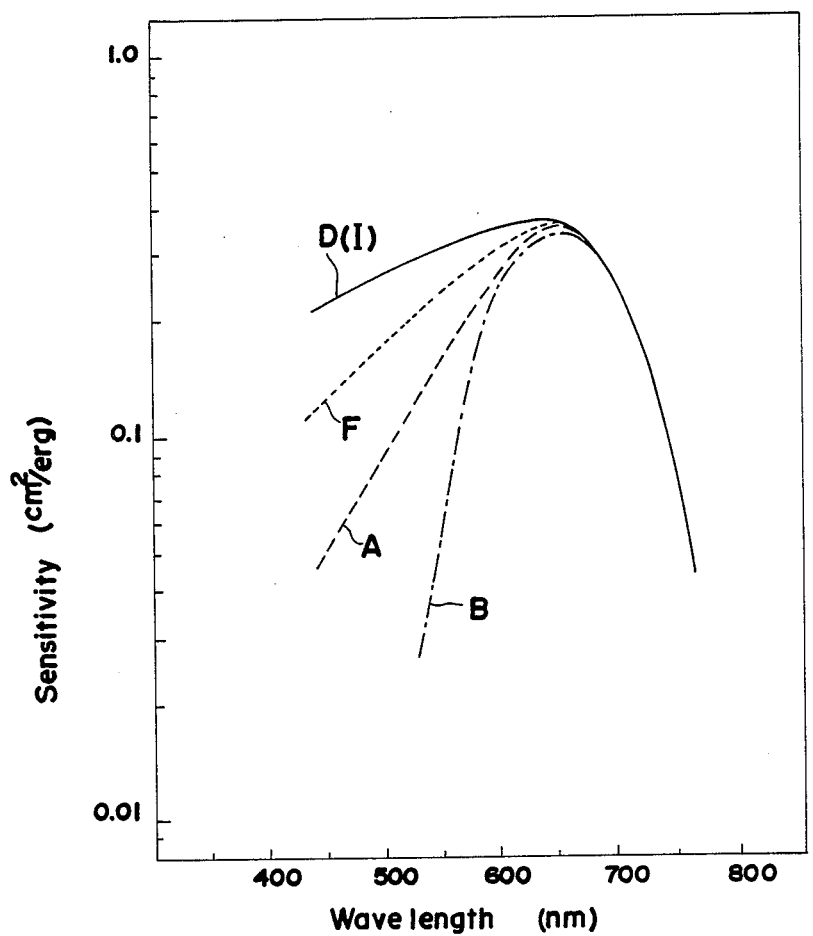
FIG. 6 is a graph showing the spectral sensitivity of the photosensitive member.

Next, Samples A, B, D, E, F and I were charged to +300 V respectively and their spectral sensitivities were measured by determining the light energy required to light decay the surface potential to one half of its potential for wavelength of 450 nm to 800 nm at every 50 nm. The results are shown in FIG. 6 in which curves A, B, D, F and I respectively correspond to Samples A, B, D, F and I. As apparent therefrom, the sensitivities in the short wavelength region in particular are remarkably improved with the increase of amount of carbon in the insulating layer as seen by comparing curves B, A and D which contain 7, 40 and 60 atomic % of carbon, respectively. Sample E with 70 atomic % of carbon showed substantially the same characteristic as curve D, indicating that the sensitivity does not change with carbon of more than about 60 atomic %.

When curves A and F, which contain 40 atomic % of carbon, respectively, Sample F further containing 5 atomic % of oxygen, are compared, the sensitivity is higher for Sample F, indicating that inclusion of oxygen together with about 40 atomic % of carbon improves the sensitivity in the same way as increasing the amount of carbon. On the other hand, it was observed that inclusion of oxygen together with about 5 to 20 atomic % of carbon showed no improvement in the sensitivity in the short wavelength region. Thus, unless such a photosensitive member is used for exposure at wavelength of higher than 650 nm, i.e., as in laser beam printer, it is preferable that the amount of carbon in the insulating layer be about 40 to 65 atomic %.

Measurements of surface hardness of each of Samples A-J showed that those with carbon and no oxygen in the insulating layer had generally weaker hardness than the samples with oxygen and carbon. It particular, Sample E with 70 atomic % of carbon experienced frictional damage. Sampes F-I showed no damage on the surfaces even by continuous copying, but Sample J, which contains 70 atomic % of carbon and 5 atomic % of oxygen, showed a rapid rise of residual potential, although no frictional damage was observed.

Finally, each of these Samples A-J were placed in an EP-520 image transfer type copying machine made by Minolta Camera K.K. for continuous copying of 50,000 copies at a temperature of 30° C. and a humidity of 80%. Images obtained from Samples B and C began to blur after 10,000 copies. Those obtained from Samples E and J began to fog due to increase of residual potential after about 10,000 copies. Samples A and D reproduced better images than Samples B, C, E and J but images began to blur and a white dot pattern appeared. In contrast, Samples F, G, H and I, particularly Samples F and I, reproduced images of high resolution and good half tone from the first copy to the last copy.

EXPERIMENTAL EXAMPLE 2

Under the same conditions as Example 1, an a-Si photoconductive layer 2 was formed on the substrate 31 of aluminum drum and then the application of power from the high frequency power source 35 was suspended while the flow amounts of mass flow controllers were set to zero and the chamber evacuated. Thereafter, 210 sccm of $H_2$ gas from the first tank 5, 300 sccm of $SiH_4$ gas diluted to 30% by $H_2$ from the second tank 6, 90 sccm of $C_2H_4$ gas from the fourth tank 8 and 1 sccm of $O_2$ gas from the fifth tank 9 were introduced into the chamber 29 and the power of 300 watts was applied. Simultaneously with this, the mass flow controller 19 was adjusted to raise the scale such that the flow amount of $O_2$ gas from the fifth tank 9 was varied from 1 sccm to 40 sccm evenly in 3 minutes thereby forming the insulating layer 3 of about 0.1 micron thick and containing a-Si, hydrogen, 40 atomic % of carbon and 0.5 to 20 atomic % of oxygen with its amount gradually increasing.

This photosensitive member was then placed in an EP-520 copying machine and 50,000 copies were produced successively. As the result, good quality images which were free from image blurs were obtained from the first copy to the last copy.

COMPARATIVE EXAMPLE 1

The a-Si photoconductive layer 2 was formed on the substrate 31 under the same conditions as Experimental Example 2 and followed thereby, 210 sccm of $H_2$ gas from the first tank 5, 300 sccm of $SiH_4$ gas diluted to 30% by $H_2$ from the second tank 6, 90 sccm of $C_2H_4$ gas from the fourth tank 8 and 50 sccm of $O_2$ gas from the fifth tank 9 were introduced into the chamber 29 and the glow discharge was effected to form the insulating layer 3 containing a-Si, hydrogen, 40 atomic % of carbon and 30 atomic oxygen.

This photosensitive member was placed in an EP-520 copying machine for continuous copyings and the images obtained showed blurs from the first several copies.

EXPERIMENTAL EXAMPLE 3

The reaction chamber 29 was evacuated to $10^{-6}$ torr by means of the rotary pump 37 and diffusion pump 38. Followed thereby, the first to fifth regulating valves 10, 11, 12, 13 and 14 are opened to release and flow $H_2$ gas from the first tank 5, $SiH_4$ gas diluted to 30% by $H_2$ from the second tank 6, $B_2H_6$ gas diluted to 200 ppm by $H_2$ from the third tank 7, $C_2H_4$ gas from the fourth tank 8 and further $O_2$ gas from the fifth tank 9 into the mass flow controllers 15, 16, 17, 18, 19 under a pressure gauge showing of 1 kg/cm². By adjusting the scales of the respective mass flow controllers, the flow amounts were set to 245 sccm for $H_2$, 300 sccm for $SiH_4$, 45 sccm for $B_2H_6$, 90 sccm for $C_2H_4$ and 10 sccm for $O_2$ and fed into the reaction chamber 29. The pressure inside the chamber was then adjusted to 1.0 torr after the respective flow amounts have become stabilized. On the other hand, an aluminum drum of 120 mm in diameter was used as the substrate 31 and preheated to a temperature of 200° C.

With the flow amount of respective gases and the inner pressure of the chamber stabilized, a high frequency power of 300 watts (frequency of 13.56 MHz) from the power source 35 was applied to the electrode 34 to generate glow discharge. This glow discharge was continued for about 3 minutes to form a barrier layer 4 of 0.1 micron thick on the substrate 31 which includes a-Si, hydrogen, about 200 ppm of boron, 40 atomic % of carbon and 5 atomic % of oxygen.

Upon formation of the barrier layer 4, the application of power from the high frequency power source 35 was suspended while the flow amounts of mass flow controllers were set to zero and the chamber evacuated. Thereafter, 274 sccm of $H_2$ gas from the first tank 5, 300 sccm of $SiH_4$ gas diluted to 30% by $H_2$ from the second tank 6, 25 sccm of $B_2H_6$ gas from the third tank 7 and 1 sccm of $O_2$ gas from the fifth tank 9 were introduced into the chamber 29 and a power of 300 watts was applied with the inner pressure adjusted to 1.0 torr. The glow discharge was continued for 7 hours to form the a-Si photoconductive layer 2 having a thickness of about 20 microns and containing a-Si, hydrogen, boron and a small amount of oxygen.

The formed photosensitive member was first charged and exposed to white light of 2.0 lux.sec to measure the residual potential. The result showed the residual potential of 0 V. This photosensitive member was then placed in an EP-520 copying machine for continuous copying of 50,000 copies. The copies obtained had excellent resolution and were free of blur from the first copy to the last copy. After 50,000 continuous copyings, the residual potential was measured again but hardly any rise was observed. Moreover, no separation of the barrier layer from the substrate was noted.

EXPERIMENTAL EXAMPLE 4

Under the same conditions as Experimental Example 3, a photosensitive member of the same construction but without boron in the barrier layer 4 was formed. This photosensitive member was then similarly subjected to continuous copying of 50,000 copies and images of high quality and good resolution were obtained from the first copy to the last copy. Also the residual potential after 50,000 copies was less than 50 V, which is only slightly higher than Experimental Example 3.

COMPARATIVE EXAMPLE 2

Under the same conditions as Experimental Example 3 except for setting the flow amount of $O_2$ gas from the fifth tank 9 to be 50 sccm during the formation of the barrier layer 4, a photosensitive member of the same construction but containing about 25 atomic % of oxygen in addition to 40 atomic % of carbon in the barrier layer was formed. This photosensitive member was set in EP-520 for continuous copying. However, the images began to fog from the several thousandth copy and became more noticeable as the copyings were continued.

EXPERIMENTAL EXAMPLE 5

The reaction chamber 29 was evacuated to $10^{-6}$ torr by means of the rotary pump 37 and diffusion pump 38. Followed thereby, the first to fifth regulating valves 10, 11, 12, 13 and 14 are opened to release and flow $H_2$ gas from the first tank 5, $SiH_4$ gas diluted to 30% by $H_2$ from the second tank 6, $B_2H_6$ gas diluted to 200 ppm by $H_2$ from the third tank 7, $C_2H_4$ gas from the fourth tank 8 and further $O_2$ gas from the fifth tank 9 into the mass flow controllers 15, 16, 17, 18, 19 under a pressure gauge showing of 1 kg/cm². By adjusting the scales of respective mass flow controllers, the flow amounts were set to 245 sccm for $H_2$, 300 sccm for $SiH_4$, 23 sccm for $B_2H_6$, 90 sccm for $C_2H_4$ and 10 sccm for $O_2$ and fed into the reaction chamber 29. The pressure inside the chamber was then adjusted to 1.0 torr after the respective flow amounts have become stabilized. On the other hand, an aluminum drum of 120 mm in diameter was used as the substrate 31 and pre-heated to the temperature of 200° C.

With the flow amount of respective gases and the inner pressure of the chamber stabilized, a high frequency power of 300 watts (frequency of 13.56 MHz) from the power source 35 was applied to the electrode 34 to generate glow discharge. This glow discharge was continued for about 3 minutes to form a barrier layer 4 of 0.1 micron thick on the substrate 31 which includes a-Si, hydrogen, about 100 ppm of boron, 40 atomic % of carbon and 5 atomic % of oxygen.

Upon formation of the barrier layer 4, the application of power from the high frequency power source 35 was suspended while the flow amounts of mass flow controllers were set zero and the chamber evacuated. Thereafter, 274 sccm of $H_2$ gas from the first tank 5, 300 sccm of $SiH_4$ gas diluted to 30% by $H_2$ from the second tank 6, 200 sccm of $B_2H_6$ gas from the third tank 7 and 1 sccm of $O_2$ gas from the fifth tank 9 were introduced into the chamber 29 and the power of 300 watts was applied with the inner pressure adjusted to 1.0 torr. The glow discharge was continued for 7 hours to form the a-Si photoconductive layer 2.

The application of power from the power source 35 was suspended upon formation of the a-Si photoconductive layer 2 and the flow amounts of mass flow controllers were set to zero and the chamber evacuated. Thereafter, 200 sccm of $H_2$ gas from the first tank 5, 300 sccm of $SiH_4$ gas diluted to 30% by $H_2$ gas from the second tank 6, 90 sccm of $C_2H_4$ gas from the fourth tank 8 and 10 sccm of $O_2$ gas from the fifth tank 9 were introduced into the chamber 29 and the power of 300 watts was applied with the inner pressure adjusted to 1.0 torr. The glow discharge was continued for 3 minutes to form an insulating layer 3 of 0.1 micron thick and containing a-Si, hydrogen, 40 atomic % of carbon and 5 atomic % of oxygen.

This photosensitive member had excellent adhesion between the substrate and the barrier layer. When subjected to continuous copying of 50,000 copies, images of good quality and high resolution free of any fog and blur were obtained from the first copy to the last copy. Moreover, there was hardly any rise in the resudual potential.

EXPERIMENTAL EXAMPLE 6

Under the same conditions as Experimental Example 5 except for setting the flow amount of $B_2H_6$ gas to be 45 sccm during the formation of the barrier layer, a photosensitive member of the same construction was formed but containing 200 ppm of boron in the barrier layer 4.

This photosensitive member was set in an EP-520 copier and subjected to continuous copying. The images obtained had good resolution, excellent half-tone and high density from the first copy to the last copy. Moreover, copies of good quality were obtained even at a high temperature of 30° C. and a humidity of 80%.

EXPERIMENTAL EXAMPLE 7

Under the same condition as Experimental Example 5 except for inhibiting the flow of $B_2H_6$ gas from the second tank 6 during the formation of the barrier layer, a photosensitive member of the same construction but not containing any boron in the barrier layer was formed. This photosensitive member was then subjected to continuous copying of 50,000 copies and images of good copies were obtained. The residual potential was only slightly higher than Experimental Example 6 and was less than 50 V even after 50,000 copies.

EXPERIMENTAL EXAMPLE 8

Under the same conditions as Experimental Example 7, barrier layer containing a-Si, hydrogen, 40 atomic % of carbon and 5 atomic % of oxygen was formed on the substrate 31 and then the a-Si photoconductive layer was formed on the barrier layer. Subsequent to formation of the photoconductive layer, 210 sccm of $H_2$ gas from the first tank 5, 300 sccm of $SiH_4$ gas diluted to 30% by $H_2$ from the second tank 6, 90 sccm of $C_2H_4$ gas from the fourth tank 8 and 1 sccm of $O_2$ gas from the fifth tank 9 were introduced into the chamber and the power of 300 watts was applied to the electrode 34 with the inner pressure adjusted to 1.0 torr. Simultaneously with this, the mass flow controller 19 was adjusted to raise the scale such that the flow amount of $O_2$ gas from the fifth tank 9 was varied from 1 sccm to 40 sccm evenly in 3 minutes thereby forming the insulating layer 3 of about 0.1 micron thick and containing a-Si, hydrogen, 40 atomic % of carbon and 0.5 to 20 atomic % of oxygen with its amount gradually increasing.

When this photosensitive member was subjected to continuous copying, images of good resolution and good continuous half-tone were obtained. Images similarly as good were obtained even at a high temperature of 30° C. and a humidity of 80%.

EXPERIMENTAL EXAMPLE 9

Under the same conditions as Experimental Example 5 except for setting the flow amounts to be 382 sccm for $H_2$ gas, 150 sccm for $SiH_4$ gas, 23 sccm for $B_2H_6$ gas and 45 sccm for $O_2$ gas during the formation of the barrier layer 4, a photosensitive member which sequentially includes on the substrate 31 the barrier layer 4 of 0.1 micron thick and containing a-Si, hydrogen, 100 ppm of boron and 25 atomic % of oxygen, the photoconductive layer 2 containing a-Si, hydrogen, boron and oxygen and the insulating layer 3 containing a-Si, hydrogen, 40 atomic % of carbon and 5 atomic % of oxygen. The photosensitive member formed in this way had excellent adhesion and images of good quality with no fog or blur were obtained even with continuous copying of 50,000 copies.

COMPARATIVE EXAMPLE 3

Under the same conditions as Experimental Example 5 except for inhibiting the flow of $O_2$ gas from the fifth tank 9 during the formation of the barrier layer 4, a photosensitive member of the same construction but not containing oxygen in the barrier layer 4 was formed. However, the barrier layer was partially separated upon removal from the reaction chamber 29 showing deterioration of adhesion with the substrate.

COMPARATIVE EXAMPLE 4

Figure 7:
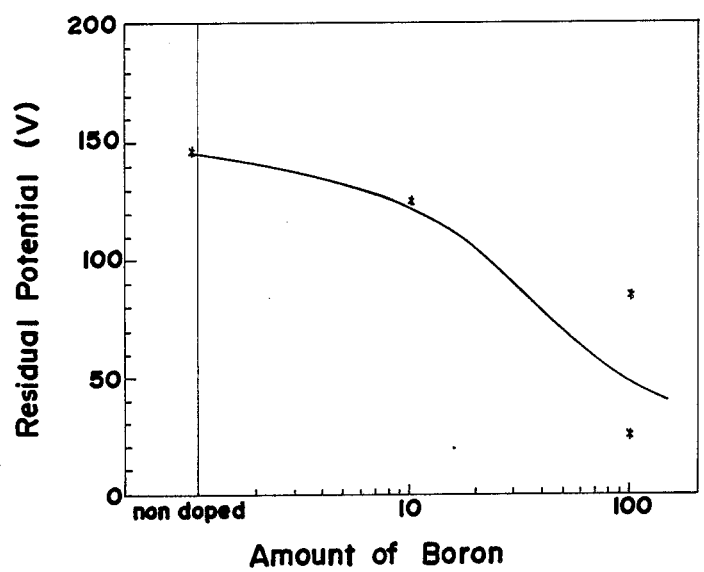
FIG. 7 is a graph showing the relationship between residual potential and amount of boron in the barrier layer of the photosensitive member.

Under the same conditions as Experimental Example 9 except for inhibiting the flow of $B_2H_6$ gas from the second tank 6 during the formation of the barrier layer 4, a photosensitive member of the same construction but containing only a-Si, hydrogen and 25 atomic % of oxygen in the barrier layer 4 was formed. This photosensitive member, when set in an EP-520 copying machine for continuous copying of 50,000 copies, reproduced fogged images from the several thousandth copy, and fogging of the images became more noticeable as the copying operation was continued. This is attributable to an increase of the residual potential and has a close relationship with the amount of boron in the barrier layer 4 as shown in FIG. 7. As apparent from FIG. 7, the residual potential decreases with a increase in the amount of boron in the barrier layer 4. However, an increase in the boron in turn causes gradual decrease of surface potential, i.e., charge accepting capability of the photosensitive member and the amount of boron should not be more than 200 ppm.

Numerous modifications and variations of the present invention are possible in the light of the above teachings and, therefore, within the scope of the appended claims, the invention may be practiced otherwise than as particularly described.

What is claimed is:

1. A photosensitive member which comprises an electrically-conductive substrate; a barrier layer on said substrate, said barrier layer having a thickness of about 0.003 to 2 microns and including amorphous silicon, about 5 to 60 atomic % of carbon, less than about 10 atomic % of oxygen and between about 100 to about 200 ppm of boron; a photoconductive layer on said barrier layer, said photoconductive layer having a thickness of about 5 to 100 microns and including amorphous silicon; and an insulating layer on said photoconductive layer, said insulating layer having a thickness of about 0.003 to 2 microns and including amorphous silicon, about 5 to 65 atomic % of carbon and less than about 10 atomic % of oxygen, both said carbon and said oxygen being uniformly distributed within said insulating layer.

2. A photosensitive member as claimed in claim 1 wherein the amount of carbon in said insulating layer is 40 to 65 atomic %.

3. A photosensitive member which comprises an electrically-conductive substrate; a barrier layer on said substrate, said barrier layer having a thickness of about 0.003 to 2 microns and including amorphous silicon, about 5 to 60 atomic % of carbon, less than about 10 atomic % of oxygen and between about 100 to about 200 ppm of boron; a photoconductive layer on said barrier layer, said photoconductive layer having a thickness of about 5 to 100 microns and including amorphous silicon; and an insulating layer on said photoconductive layer, said insulating layer having a thickness of about 0.003 to 2 microns and including amorphous silicon, about 0.01 to 25 atomic % of oxygen and about 1 to 65 10 atomic % of carbon, the amount of said oxygen in said insulating layer gradually increasing in its thickness direction away from said photoconductive layer.

4. A photosensitive member which comprises, in sequential order, an electrically-conductive substrate; a barrier layer having a thickness of about 0.003 to 2 microns and including at least amorphous silicon, less than about 10 atomic % of oxygen and between about 100 to about 200 ppm of boron; a photoconductive layer having a thickness of about 5 to 100 microns and including amorphous silicon; and an insulating layer having a thickness of about 0.003 to 2 microns and including amorphous silicon, less than 65 atomic % of carbon and less than 10 atomic % of oxygen.

5. A photosensitive member as claimed in claim 4 wherein said barrier layer further includes about 5 to 60 atomic % of carbon.

6. A photosensitive member which comprises
an electrically-conductive substrate;
a photoconductive layer having a thickness of about 5 to 100 microns and including amorphous silicon; and
a barrier layer between said substrate and photoconductive layer, said barrier layer having a thickness of about 0.003 to 2 microns and including amorphous silicon, about 5 to 60 atomic % of carbon, less than about 10 atomic % of oxygen and between about 100 to about 200 ppm of boron.

* * * * *